United States Patent
Chen et al.

(10) Patent No.: US 11,818,563 B2
(45) Date of Patent: Nov. 14, 2023

(54) PACKAGE STRUCTURE OF MICRO SPEAKER AND METHOD FOR FORMING THE SAME

(71) Applicant: Fortemedia, Inc., Santa Clara, CA (US)

(72) Inventors: Li-Jen Chen, Hsinchu (TW); Yu-Xuan Xu, Hsinchu (TW); Yu-Ting Cheng, Hsinchu (TW); Shih-Chin Gong, Taipei (TW)

(73) Assignee: FORTEMEDIA, INC., Alviso, CA (US)

( * ) Notice: Subject to any disclaimer, the term of this patent is extended or adjusted under 35 U.S.C. 154(b) by 63 days.

(21) Appl. No.: 17/830,448

(22) Filed: Jun. 2, 2022

(65) Prior Publication Data
US 2023/0239628 A1 Jul. 27, 2023

Related U.S. Application Data

(60) Provisional application No. 63/303,129, filed on Jan. 26, 2022.

(51) Int. Cl.
| | |
|---|---|
| *H04R 9/06* | (2006.01) |
| *B81C 1/00* | (2006.01) |
| *H04R 7/04* | (2006.01) |
| *H04R 7/16* | (2006.01) |
| *H04R 1/02* | (2006.01) |
| *H04R 31/00* | (2006.01) |

(Continued)

(52) U.S. Cl.
CPC .......... *H04R 9/06* (2013.01); *B81C 1/00587* (2013.01); *H04R 1/025* (2013.01); *H04R 7/04* (2013.01); *H04R 7/16* (2013.01); *H04R 9/025* (2013.01); *H04R 9/047* (2013.01); *H04R 31/003* (2013.01); *H04R 31/006* (2013.01); *B81C 2201/014* (2013.01); *B81C 2201/0132* (2013.01); *B81C 2201/0133* (2013.01); *H04R 2307/025* (2013.01)

(58) Field of Classification Search
CPC ........ B81C 1/00587; B81C 2201/0132; B81C 2201/0133; B81C 2201/014; H04R 1/025; H04R 2307/025; H04R 31/00; H04R 31/003; H04R 31/006; H04R 7/04; H04R 7/10; H04R 7/16; H04R 9/025; H04R 9/047; H04R 9/06
See application file for complete search history.

(56) References Cited

U.S. PATENT DOCUMENTS

2020/0344551 A1* 10/2020 Chen ..................... H01F 7/0289

* cited by examiner

*Primary Examiner* — Kile O Blair
(74) *Attorney, Agent, or Firm* — McClure, Qualey & Rodack, LLP

(57) ABSTRACT

A package structure of a micro speaker is provided. The package structure includes a substrate, a diaphragm, a coil, an etch stop layer, a carrier board, a permanent magnetic element, and package lid. The substrate has a hollow chamber. The diaphragm is suspended over the hollow chamber. The coil is embedded in the diaphragm. The etch stop layer is positioned below the coil and overlaps the coil in the direction that is perpendicular to the top surface of the diaphragm. The etch stop layer is made of a metal material. The carrier board is disposed on the bottom surface of the substrate. The permanent magnetic element is disposed on the carrier board and in the hollow chamber. The package lid is wrapped around the substrate and the diaphragm, and has a lid opening that exposes a portion of the top surface of the diaphragm.

20 Claims, 16 Drawing Sheets

FIG. 3G

(51) Int. Cl.
*H04R 9/04* (2006.01)
*H04R 9/02* (2006.01)

PACKAGE STRUCTURE OF MICRO SPEAKER AND METHOD FOR FORMING THE SAME

CROSS REFERENCE TO RELATED APPLICATIONS

This application claims the benefit of U.S. Provisional Application No. 63/303,129, filed on Jan. 26, 2022, the entirety of which is incorporated by reference herein.

BACKGROUND OF THE INVENTION

Field of the Invention

The invention relates in general to a micro speaker, and in particular to a package structure of a micro speaker and a method for forming the same.

Description of the Related Art

Since electronic products are becoming smaller and thinner, how to scale down the size of electronic products has become an important topic. Micro electromechanical system (MEMS) technology is a technology that combines semiconductor processing and mechanical engineering, which can effectively reduce the size of components and produce multi-functional micro elements and micro systems.

The manufacturing of traditional moving coil speakers has become quite mature, but the traditional moving coil speakers have a larger area and are more expensive. If the micro electromechanical system (MEMS) process is used to manufacture a moving coil speaker on a semiconductor chip, the area will be reduced and the cost will be reduced, which is conducive to batch production. However, in addition to reducing the size to facilitate manufacturing, it is still necessary to develop a micro moving coil speaker with better performance and reliability.

BRIEF SUMMARY OF THE INVENTION

An embodiment of the invention provides a package structure of a micro speaker. The package structure includes a substrate, a diaphragm, a coil, an etch stop layer, a carrier board, a first permanent magnetic element, and a package lid. The substrate has a hollow chamber. The diaphragm is suspended over the hollow chamber. The coil is embedded in the diaphragm. The etch stop layer is positioned directly below the coil. The etch stop layer overlaps the coil in a direction that is perpendicular to the top surface of the diaphragm. The etch stop layer is made of a metal material. The carrier board is disposed on the bottom surface of the substrate. The first permanent magnetic element is disposed on the carrier board and in the hollow chamber. The package lid is wrapped around the substrate and the diaphragm. The package lid has a lid opening that exposes a portion of the top surface of the diaphragm.

In some embodiments, the diaphragm includes polydimethylsiloxane (PDMS), phenolic epoxy resin, polyimide, or a combination thereof.

In some embodiments, the Young's modulus of the diaphragm is between 1 MPa and 100 GPa.

In some embodiments, the thickness of the diaphragm is between 0.1 μm and 20 μm.

In some embodiments, the metal material of the etch stop layer includes aluminum, copper, aluminum-copper alloy, aluminum-silicon alloy, or aluminum-silicon-copper alloy.

In some embodiments, the thickness of the etch stop layer is greater than 100 μm.

In some embodiments, in the plan view, the etch stop layer is a continuous structure and has no openings in the gaps between adjacent coil portions of the coil.

In some embodiments, in the plan view, the etch stop layer is a discontinuous structure and includes a plurality of solid portions corresponding to coil portions of the coil and a plurality of openings corresponding to the gaps between adjacent coil portions of the coil.

In some embodiments, the etch stop layer is positioned between the coil and the hollow chamber.

In some embodiments, the coil includes a first metal layer and a second metal layer, and the first metal layer is electrically connected to the second metal layer in an opening of the diaphragm.

In some embodiments, the first metal layer and the second metal layer are each made of aluminum silicon, aluminum, copper, or a combination thereof.

In some embodiments, the width of each of the first metal layer and the second metal layer is between 1 μm and 500 μm, and the thickness of each of the first metal layer and the second metal layer is between 0.1 μm and 20 μm.

In some embodiments, the first metal layer includes a spiral structure surrounding the central axis of the diaphragm, and the second metal layer crosses over the spiral structure of the first metal layer and is electrically connected to the first metal layer.

In some embodiments, the carrier board has at least one vent hole, which is configured to allow the hollow chamber to communicate with the external environment.

In some embodiments, the package lid is made of a metal material having a magnetic permeability lower than $1.25 \times 10^{-4}$ H/m.

In some embodiments, the package structure of the micro speaker further includes a second permanent magnetic element disposed on the package lid, wherein the second permanent magnetic element is located below or above the lid opening.

Another embodiment of the invention provides a method for forming a package structure of a micro speaker, including the following steps. The method includes forming an etch stop layer over a substrate, wherein the etch stop layer is made of a metal material. The method includes forming a dielectric layer over the etch stop layer and the substrate. The method includes forming a coil structure on the dielectric layer. The method includes forming a diaphragm on the coil structure so that the coil structure is buried in the diaphragm. The method includes forming a hollow chamber in the substrate by performing an etching process on the bottom surface of the substrate. The coil structure is isolated from the hollow chamber by the etch stop layer after the etching process. The method includes attaching a carrier board to the bottom surface of the substrate. The first permanent magnetic element is mounted on the carrier board and positioned in the hollow chamber. The method includes mounting a package lid on the carrier board, wherein the package lid is wrapped around the substrate and the diaphragm. The package lid has a lid opening that exposes a portion of the diaphragm.

In some embodiments, the method further includes patterning the etch stop layer so that the etch stop layer has a discontinuous structure, wherein in the plan view, the discontinuous structure includes a plurality of solid portions corresponding to coil portions of the coil structure and a plurality of openings corresponding to the gaps between adjacent coil portions of the coil structure.

In some embodiments, the coil structure is a multi-layered structure that includes a first metal layer and a second metal layer over and electrically connected to the first metal layer. The method further includes patterning the dielectric layer to form an opening in the dielectric layer, wherein the first metal layer is electrically connected to the second metal layer in the opening.

In some embodiments, the method further includes disposing a second permanent magnetic element on the package lid, wherein the diaphragm is located between the first and second permanent magnetic elements.

BRIEF DESCRIPTION OF DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF INVENTION

Figure 1A:
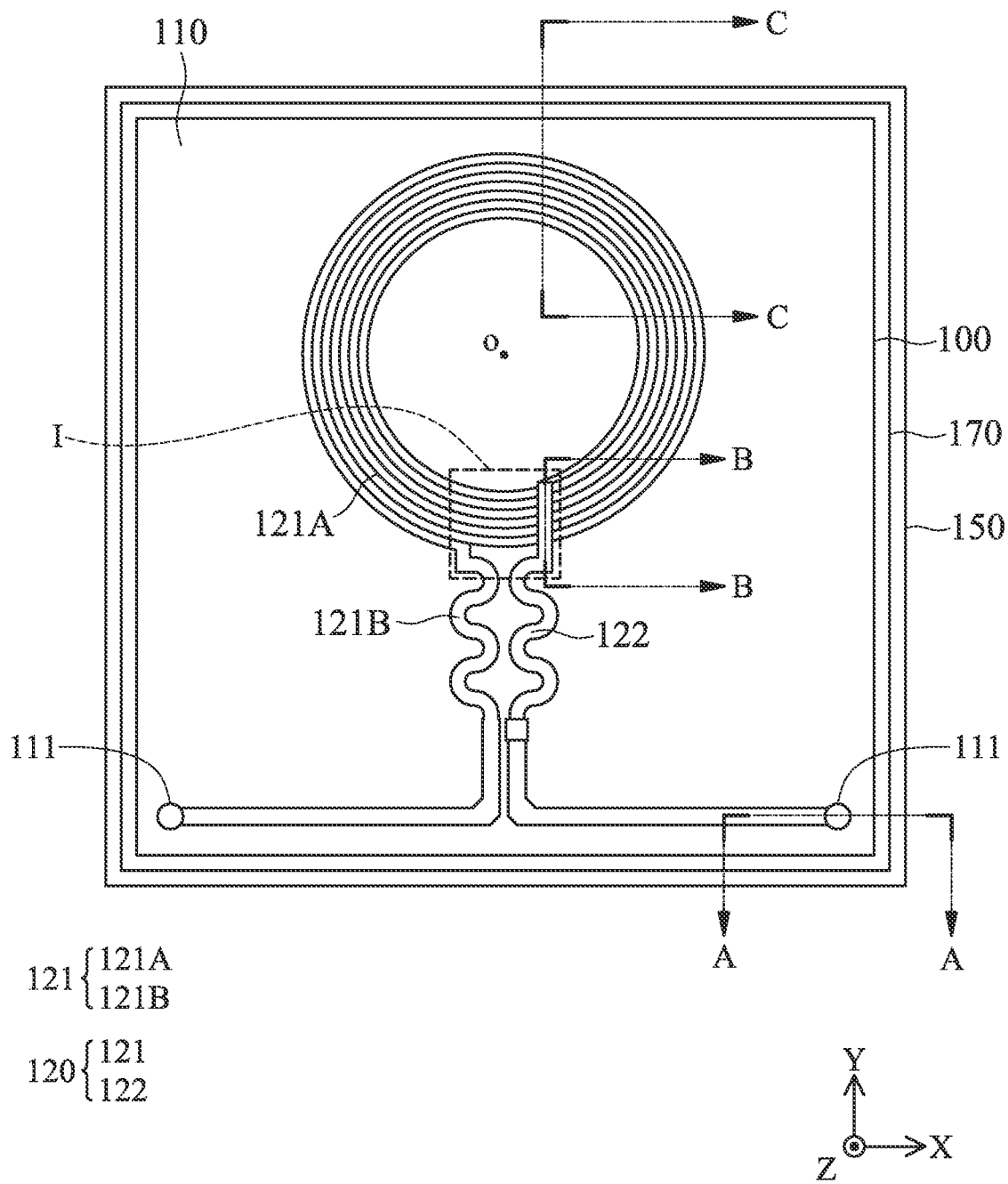
FIG. 1A illustrates a top view of a micro speaker in accordance with some embodiments.

Embodiments of a package structure of a micro speaker and a method for forming the same are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In addition, the present disclosure may repeat reference numerals and/or letters in the various examples. This repetition is for the purpose of simplicity and clarity and does not in itself dictate a relationship between the various embodiments and/or configurations discussed. Some variations of embodiments are described below. In different figures and illustrated embodiments, similar element symbols are used to indicate similar elements.

The term "permanent magnetic element" used herein refers to an element that can maintain magnetism for a long time. That is, the permanent magnetic element is not easy to lose magnetism and is not easy to be magnetized. In addition, permanent magnetic elements can also be referred to as "hard magnetic elements."

FIG. 1A illustrates a top view of a micro speaker 10 in accordance with some embodiments. The micro speaker 10 may be a moving coil speaker, and may be disposed in general electronic products. As shown in FIG. 1A, the micro speaker 10 includes a substrate 100, a diaphragm 110, a multi-layered coil 120 (which may also be referred to as a coil 120), a carrier board 150, and a package lid 170. It should be noted that in the example of FIG. 1A, the diaphragm 110 and the package lid 170 are only represented by rectangles in order to show internal structures of the micro speaker 10.

Figure 1B:
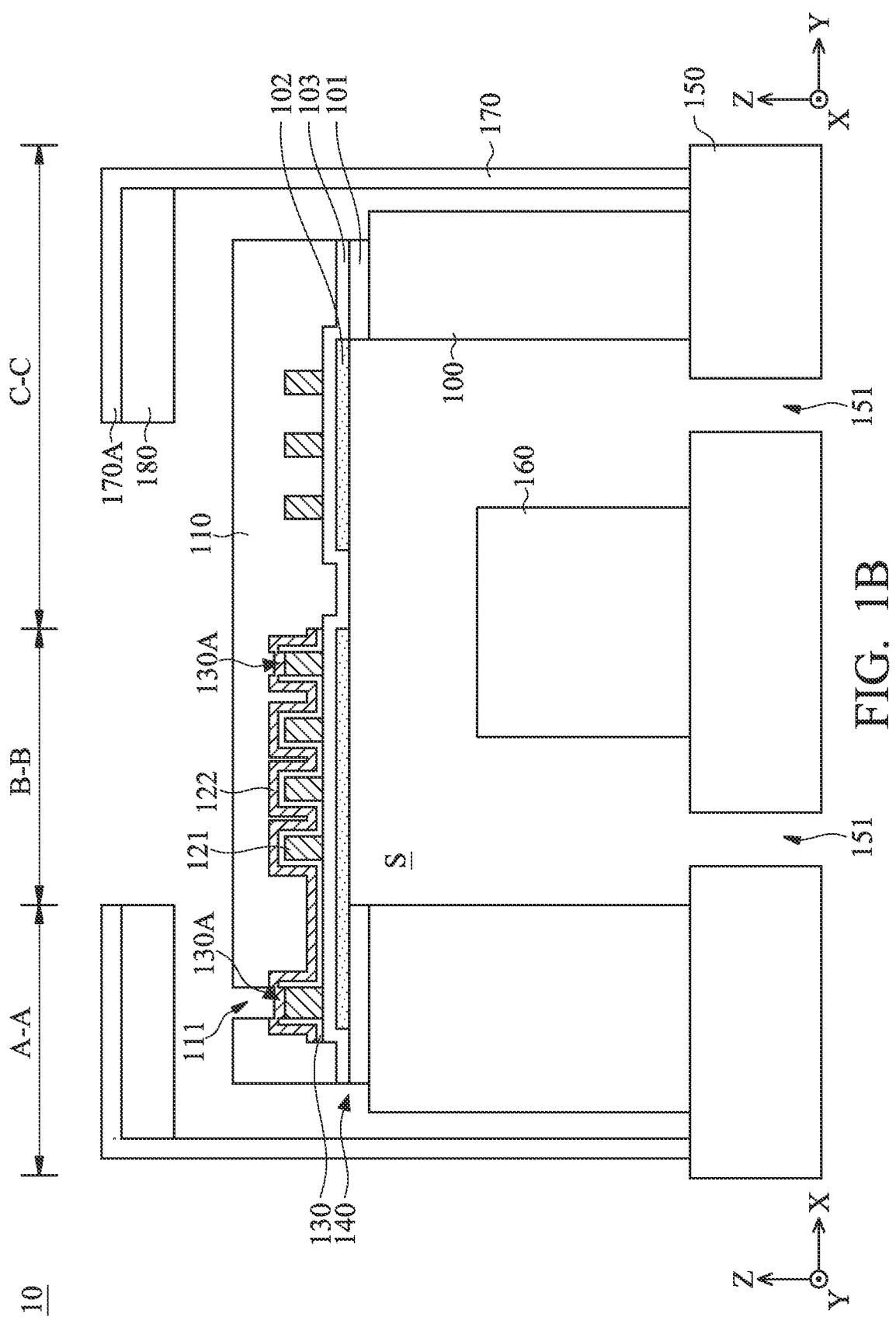
FIG. 1B illustrates a cross-sectional view of a package structure of a micro speaker in accordance with some embodiments.

FIG. 1B illustrates a cross-sectional view of the package structure of the micro speaker 10 shown in FIG. 1A in accordance with some embodiments. As shown in FIG. 1B, the diaphragm 110 is disposed on (or suspended over) the substrate 100, and it can elastically vibrate up and down in the normal direction of the substrate 100. The multi-layered coil 120 is embedded in the diaphragm 110, which means that the coil 120 is not exposed. The coil 120 is configured to transmit electric signals from a control unit (not shown) and drive the diaphragm 110 to deform relative to the substrate 100 according to the electric signals. The multi-layered coil 120 includes a first metal layer 121 and a second metal layer 122 over the first metal layer 121. For example, the first metal layer 121 and the second metal layer 122 are located on different horizontal planes, which may be parallel to the X-Y plane shown in FIG. 1B. The first metal layer 121 is electrically connected to the second metal layer 122 in an opening 111 of the diaphragm 110 to transmit electrical signals and control the operation of the micro speaker 10. At present, the resistance of speakers is mostly 8Ω or 32Ω, which is lower than that of single-layer coils. The multi-layered coils of the present disclosure can easily meet the resistance requirements.

In the present embodiment, the first metal layer 121 includes a spiral structure 121A and a wavy structure 121B in a plan view, as shown in FIG. 1A. The spiral structure 121A is disposed around the central axis O of the diaphragm 110, and the wavy structure 121B connects the spiral structure 121A to one of the openings 111 of the diaphragm 110 (see FIG. 1A, two openings 111 are formed in the diaphragm 110). By providing the wavy structure 121B, the diaphragm 110 can be more flexible and the difficulty of the oscillation can be reduced. In addition, the second metal layer 122 also includes a wavy structure in the plan view.

Figure 2:
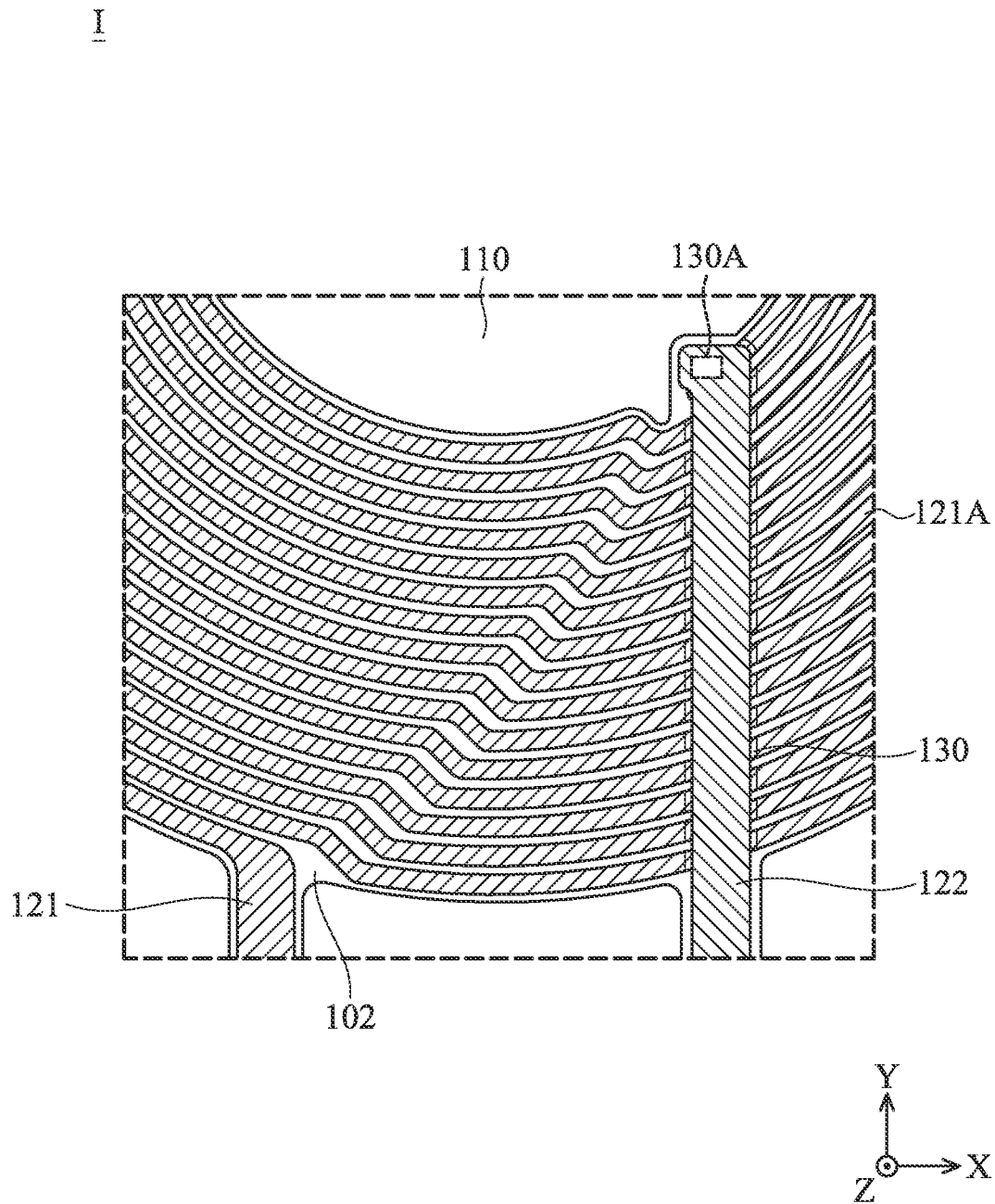
FIG. 2 illustrates an enlarged view of the area I shown in FIG. 1A in accordance with some embodiments.

FIG. 2 illustrates an enlarged view of the area I shown in FIG. 1A in accordance with some embodiments. As shown in FIGS. 1A and 2, the second metal layer 122 crosses over the spiral structure 121A of the first metal layer 121, and a dielectric layer 130 (see FIG. 2) is disposed between the first metal layer 121 and the second metal layer 122 to prevent a short circuit between the first metal layer 121 and the second metal layer 122. A through hole 130A is formed in the dielectric layer 130, and the first metal layer 121 is electrically connected to the second metal layer 122 through the through hole 130A. Furthermore, in the present embodiment, an etch stop metal layer 102 (see FIGS. 1B and 2) is disposed directly below the coil 120 and overlaps the coil 120 in the normal direction of the diaphragm 110 (i.e., the direction perpendicular to its top surface), to protect the coil 120 from being etched during the etching process (which will be described in more detail later).

Referring back to FIG. 1B, a first permanent magnetic element 160 is disposed below the diaphragm 110, and a second permanent magnetic element 180 is disposed above the diaphragm 112. The first permanent magnetic element 160 and the second permanent magnetic element 180 can attract each other to improve the frequency response of the diaphragm 110 (which will be described in more detail later). The above-mentioned components of the micro speaker 10 are arranged above the carrier board 150 (such as a printed circuit board (PCB)), and the package lid 170 (which may also be referred to a lid 170) is attached to the carrier board 150 to surround and protect the components of the micro speaker 10. The package lid 170 may also have a lid opening 170A to allow acoustic energy due to vibration of the diaphragm 110 to travel out of the package structure of the micro speaker 10. The detailed manufacturing process of the package structure of the micro speaker 10 will be described below with reference to FIGS. 3A to 3G.

FIGS. 3A to 3G illustrates cross-sectional views of intermediate stages in the formation of the package structure of the micro speaker 10 (as discussed above) in accordance with some embodiments. It should be noted that each of FIGS. 3A-3G includes cross-sectional views along lines A-A, B-B, and C-C shown in FIG. 1A. In this way, the manufacturing processes of different parts of the package structure can be shown in a single figure. Two sets of coordinate axes are provided in FIGS. 3A-3G, wherein one set of coordinate axes in the left-hand side correspond the cross-sectional view along line A-A, and the other set of coordinate axes in the right-hand side correspond the cross-sectional views along lines B-B and C-C.

Figure 3A:
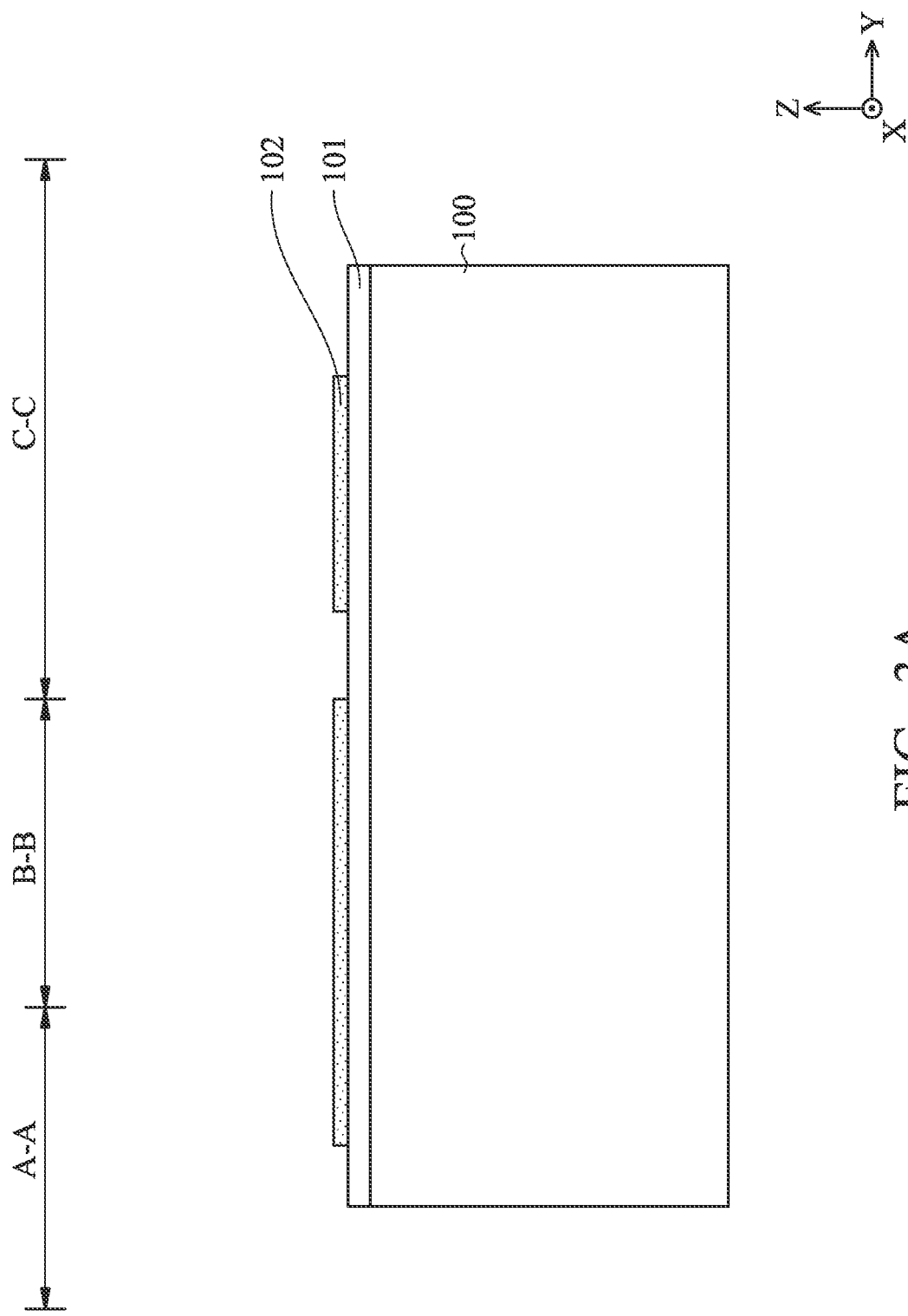
FIGS. 3A to 3G illustrates cross-sectional views of intermediate stages in the formation of a package structure of a micro speaker in accordance with some embodiments.

As shown in FIG. 3A, a dielectric layer 101 is formed on a substrate 100. In some embodiments, the substrate 100 may be part of a semiconductor wafer, and may be formed of silicon (Si). The substrate 100 may also include other semiconductor materials, such as germanium; a compound semiconductor including silicon carbide (SiC), gallium arsenic (GaAs), gallium phosphide (GaP), gallium nitride (GaN), indium phosphide (InP), and/or indium arsenide (InAs); an alloy semiconductor including SiGe, SiGeC, GaAsP, GaInAs, and/or InGaP; or combinations thereof. In some embodiments, the dielectric layer 101 is made of or includes silicon dioxide ($SiO_2$) or other suitable insulating materials. The dielectric layer 101 may be formed on the substrate 100 through thermal oxidation, chemical vapor deposition (CVD), low pressure CVD (LPCVD), atmospheric pressure CVD (APCVD), plasma-enhanced chemical vapor deposition (PECVD), or a combination thereof.

Next, an etch stop metal layer 102 (which may also be referred to as an etch stop layer 102) is formed on the dielectric layer 101. In some embodiments, the etch stop metal layer 102 is made of or includes aluminum, copper, aluminum-copper alloy, aluminum-silicon alloy, aluminum-silicon-copper alloy, or other suitable metal materials that can protect the subsequently formed coil 120 from being etched during the etching process of the substrate 100 illustrated in FIG. 3E. The etch stop metal layer 102 may be formed by electroplating or other deposition processes such as physical vapor deposition (PVD), sputtering or evaporation. The formed etch metal stop layer 102 is then patterned (not shown separately) such that the remainder of the patterned etch stop metal layer 102 is located directly below the subsequently formed coil 120 (see FIGS. 3B and 3C, for example) and overlaps the coil 120 in the plan view (as shown in FIG. 2). The patterning process may include photolithography processes (for example, photoresist coating, soft baking, mask alignment, exposure, post-exposure baking, photoresist development, other suitable processes or a combination thereof), etching processes (for example, wet etching process, dry etching process, other suitable processes or a combination thereof), other suitable processes, or a combination thereof.

In the present embodiment, the patterned etch stop metal layer 102 is a complete, continuous structure for the corresponding coil 120 above. That is, the patterned etch stop metal layer 102 has no openings in the gaps between adjacent coil portions (the terms "coil portions" used herein refer to the solid portions of the coil 120), as shown in FIG. 2. In some embodiments, the thickness of etch stop metal layer 102 may be preferably more than about 100 μm for better protection, but the present disclosure is not limited thereto.

Figure 3B:
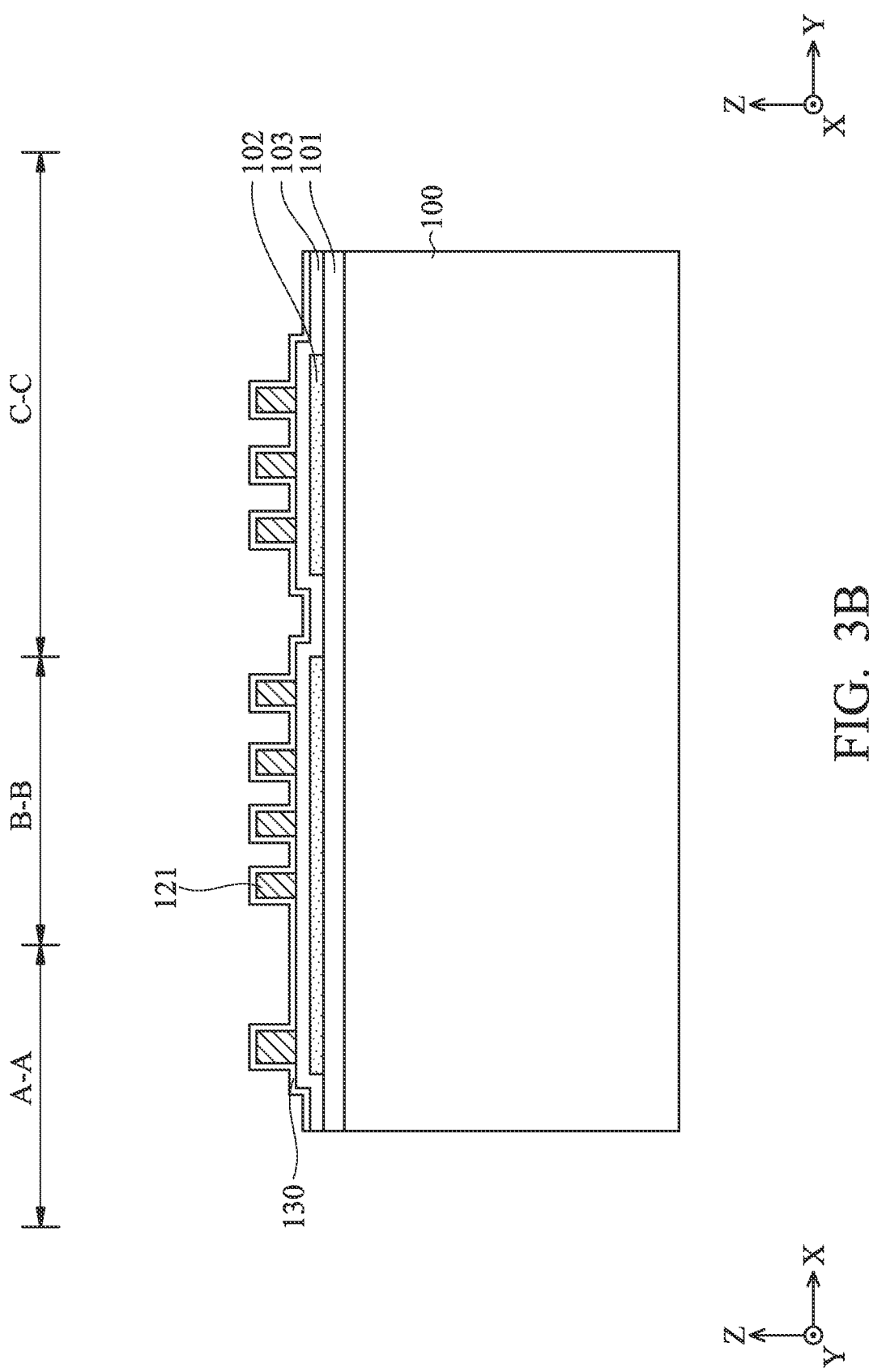

As shown in FIG. 3B, a dielectric layer 103 is conformally formed on the etch stop metal layer 102 and the dielectric layer 101. The materials and formation method of the dielectric layer 103 may be the same as or similar to those of the dielectric layer 101, and are not repeated here. After the dielectric layer 103 is formed, a first metal layer 121 of the coil 120 is formed on the dielectric layer 103. In some embodiments, the first metal layer 121 includes aluminum silicon alloy, aluminum, copper, a combination thereof, or other suitable metal materials. The first metal layer 121 may be formed through electroplating or other deposition processes such as physical vapor deposition (PVD), sputtering or evaporation. The first metal layer 121 is then patterned (not shown separately) to form the spiral structure 121A and the wavy structure 121B as shown in FIG. 1A. The patterning process may include photolithography processes (for example, photoresist coating, soft baking, mask alignment, exposure, post-exposure baking, photoresist development, other suitable processes or a combination thereof), etching processes (for example, wet etching process, dry etching process, other suitable processes or a combination thereof), other suitable processes, or a combination thereof. In some embodiments, the width of the first metal layer 121 may be in a range between about 1 μm and about 500 and the thickness of the first metal layer 121 may be in a range between about 0.1 μm and about 20 μm.

Still referring to FIG. 3B, a dielectric layer 130 is conformally formed on the first metal layer 121 and the dielectric layer 103. In some embodiments, the dielectric layer 130 is made of or includes carbon-doped oxides or other suitable insulating materials, and may be formed through furnace process or chemical vapor deposition (CVD) process.

Figure 3C:
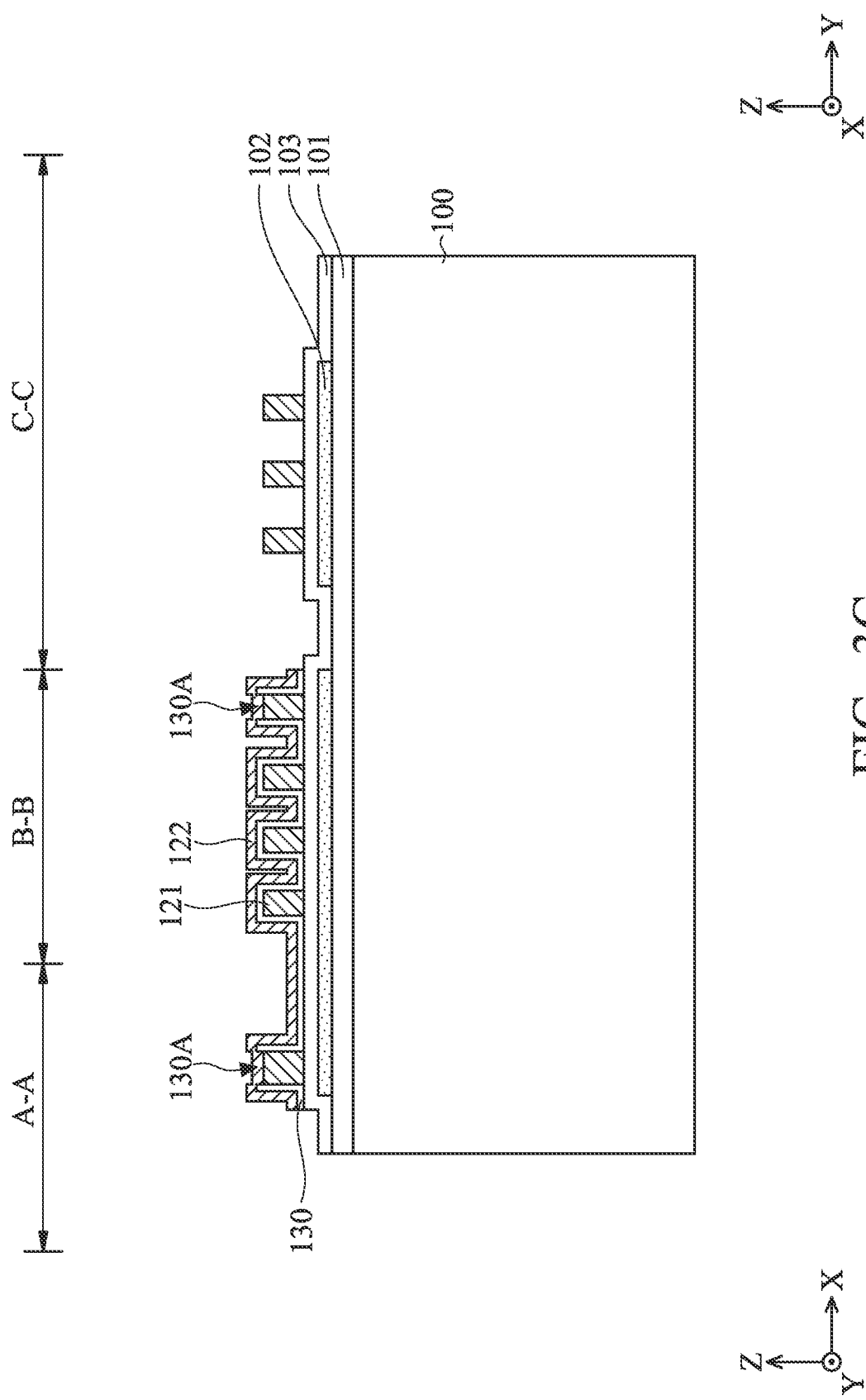

As shown in FIG. 3C, the dielectric layer 130 is then patterned (e.g., through a photolithography process and an etching process, not shown separately) to form through holes 130A in the dielectric layer 130 to expose a portion of the first metal layer 121. Next, the second metal layer 122 of the coil 120 is formed on the dielectric layer 130 and the first metal layer 121 through electroplating or other deposition processes such as physical vapor deposition (PVD), sputtering or evaporation. In some embodiments, the first metal layer 121 includes aluminum silicon alloy, aluminum, copper, a combination thereof, or other suitable metal materials.

The second metal layer 122 is then patterned (e.g., through a photolithography process and an etching process, not shown separately), leaving portions located on the dielectric layer 130 and in the through holes 130A. It should be noted that the patterned dielectric layer 130 only leaves a portion required to electrically insulate the first metal layer 121 and the second metal layer 122. By removing undesired portions of the dielectric layer 130, the diaphragm 110 (see FIG. 1B) can be more flexible, thereby improving the performance of the micro speaker 10. In some embodiments, the width of the second metal layer 122 may be in a range between about 1 µm and about 500 µm, and the thickness of the second metal layer 122 may be in a range between about 0.1 µm and about 20 µm.

Although not shown, a protection layer (which may also be referred to a passivation layer) may also be conformally formed on the first metal layer 121 and the second metal layer 122 of the coil 120 for protection. In some embodiments, the protection layer has a multi-layered structure and includes an oxide layer (e.g., silicon oxide) and a nitride layer (e.g., silicon nitride) over the oxide layer. In other embodiments, the protection layer has a single layer structure, e.g., having a single nitride layer. The protection layer may be formed using, for example, CVD, PVD, another applicable process, or a combination thereof.

Figure 3D:
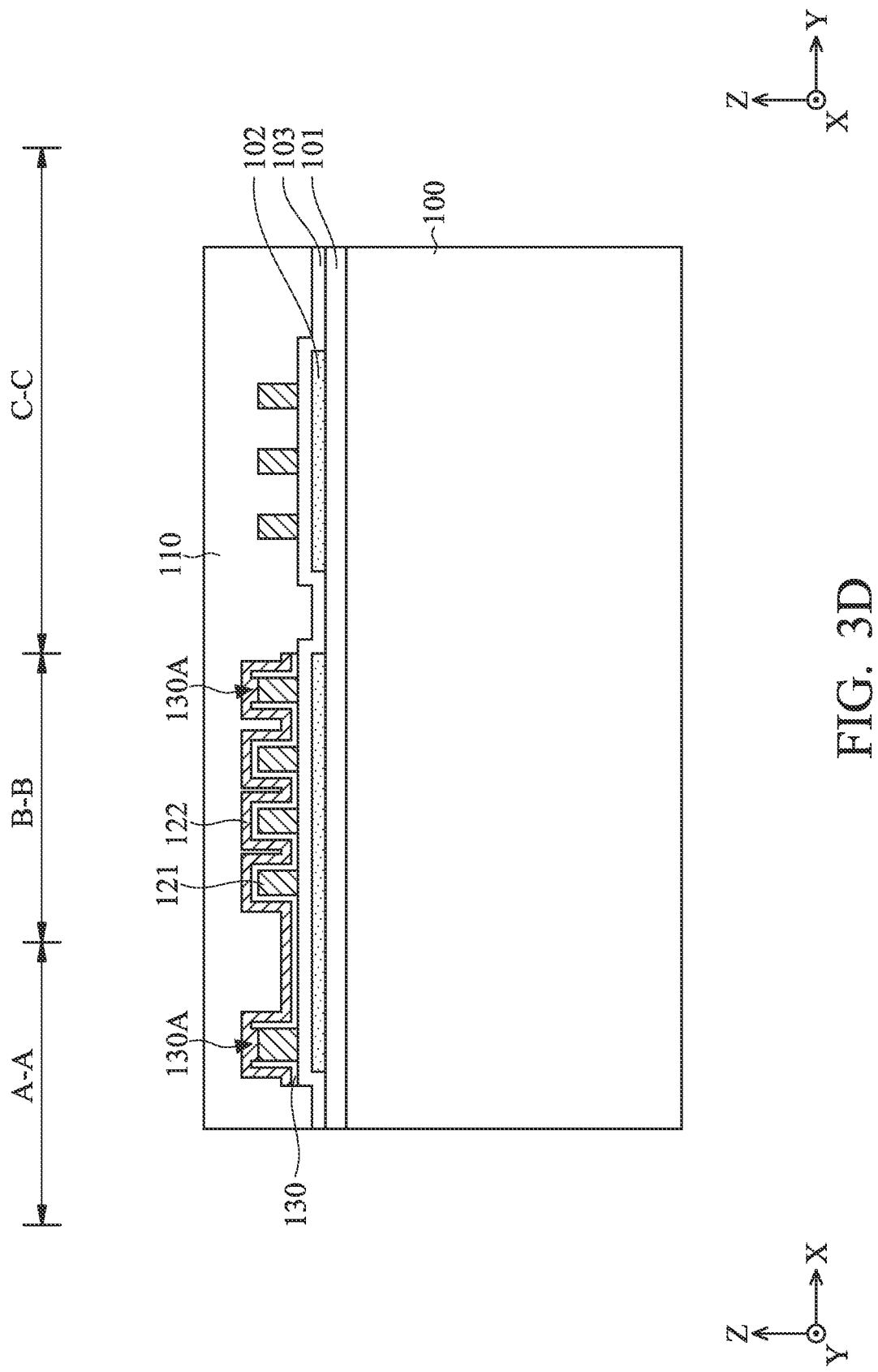

As shown in FIG. 3D, a diaphragm 110 is formed on the first and second metal layers 121 and 122 of the multi-layered coil 120, on the dielectric layer 130, and on the dielectric layer 103 (and on the protection layer, if any) such that the first metal layer 121, the second metal layer 122, the dielectric layer 130, and the dielectric layer 103 are embedded in the diaphragm 110. The diaphragm 110 may be formed through spin coating, slot-die coating, blade coating, wire bar coating, gravure coating, spray coating, chemical vapor deposition (CVD), another applicable process, or a combination thereof. In some embodiments, the diaphragm 110 is made of or includes polydimethylsiloxane (PDMS), phenolic epoxy resin (such as SU-8), polyimide (PI), or a combination thereof. In an example, the diaphragm 110 is formed of PDMS, and the Young's modulus of the diaphragm 110 is in a range between about 1 MPa and about 100 GPa. Compared with a diaphragm formed of polyimide, the diaphragm 110 formed of PDMS has a smaller Young's modulus and a softer film structure, which makes the diaphragm 110 have a larger displacement, thereby generating a larger sound amplitude. In some embodiments, the thickness of the diaphragm 110 is in a range between about 0.1 µm and about 20 µm.

Figure 3E:
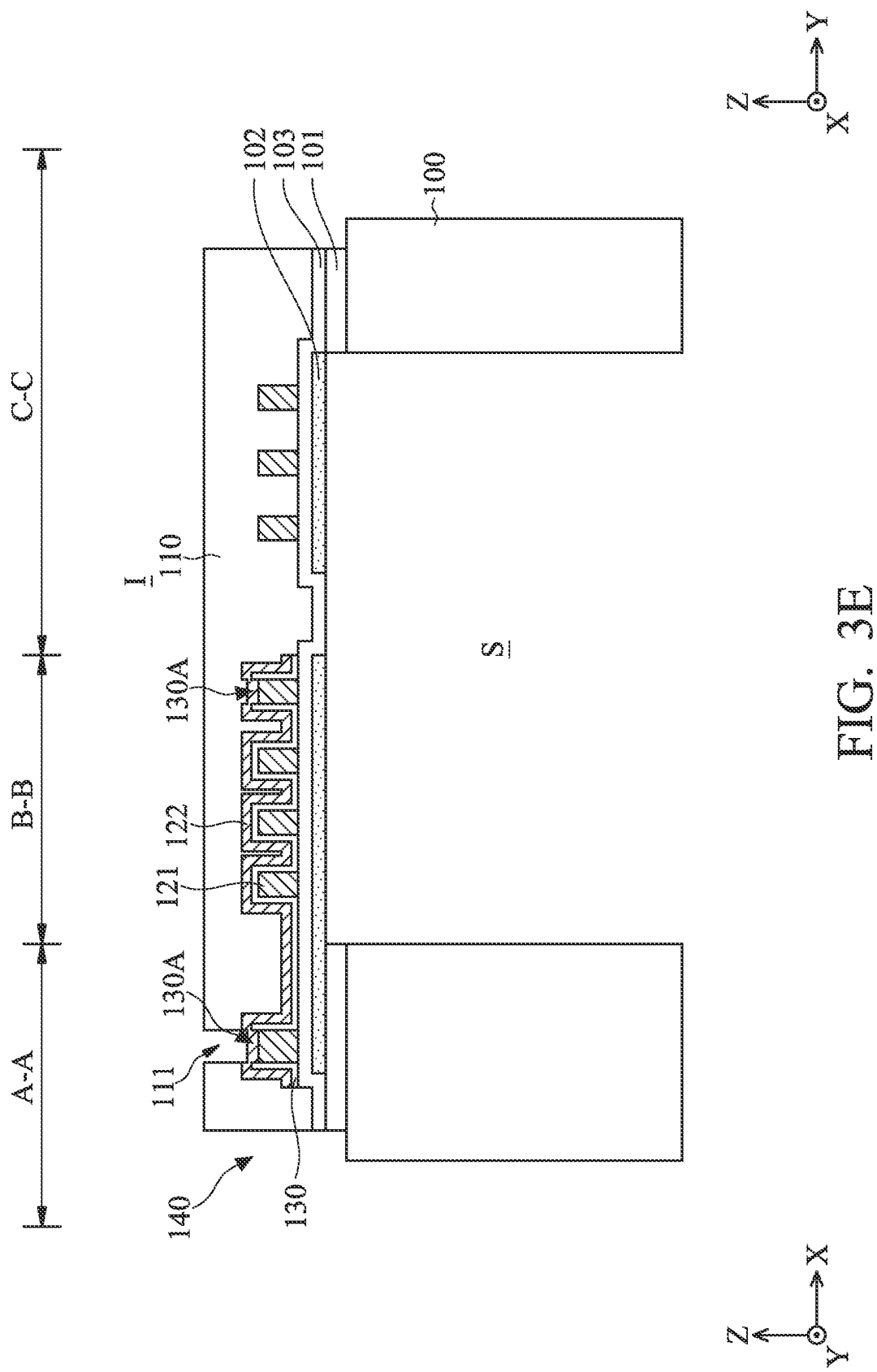

As shown in FIG. 3E, the diaphragm 110 is then patterned to form openings 111 (only one opening 111 is illustrated) in the diaphragm 110 and a cutting groove 140 surrounding the diaphragm 110. In some embodiments where the diaphragm 110 is made of a photosensitive material such as a photosensitive polymer material, the openings 111 and cutting groove 140 are formed by using photolithography techniques. In other embodiments where the diaphragm 110 is made of a non-photosensitive material, the openings 111 and cutting groove 140 are formed by using drilling, cutting, and/or other suitable patterning techniques. The openings 111 are configured to expose the second metal layer 122. The first metal layer 121 is electrically connected to the second metal layer 122 in one of the openings 111, as mentioned above. In other words, when viewed in a vertical direction (Z-axis), one of the openings 111 of the diaphragm 110 and one of the through holes 130A may overlap. The cutting groove 140 is configured to define areas on the wafer for each package structure (of the micro speaker 10). In this way, the cutting groove 140 may facilitate cutting (for example, laser cutting) to separate the package structure.

Still referring to FIG. 3E, a deep reactive-ion etching process or an etching process which applies an etchant (such as ammonium hydroxide (NH4OH), hydrofluoric acid (HF), deionized water, tetramethylammonium hydroxide (TMAH), potassium hydroxide (KOH)) is performed on the substrate 100 to form a hollow chamber S in the substrate 100. As shown in FIG. 3E, the diaphragm 110 is suspended over the hollow chamber S after the etching process. It should be understood that the dielectric layers 101 and 103 and the etch stop metal layer 102 can be used as etch stop layers to protect the diaphragm 110 and the multi-layered coil 120 from being etched. Moreover, the etch stop layer 102 made of a metal material protects the coil 120 better than the example with only dielectric layer 101 and 103 (i.e., no etch stop metal layer). Therefore, process yield and device/product reliability can be improved.

Figure 3F:
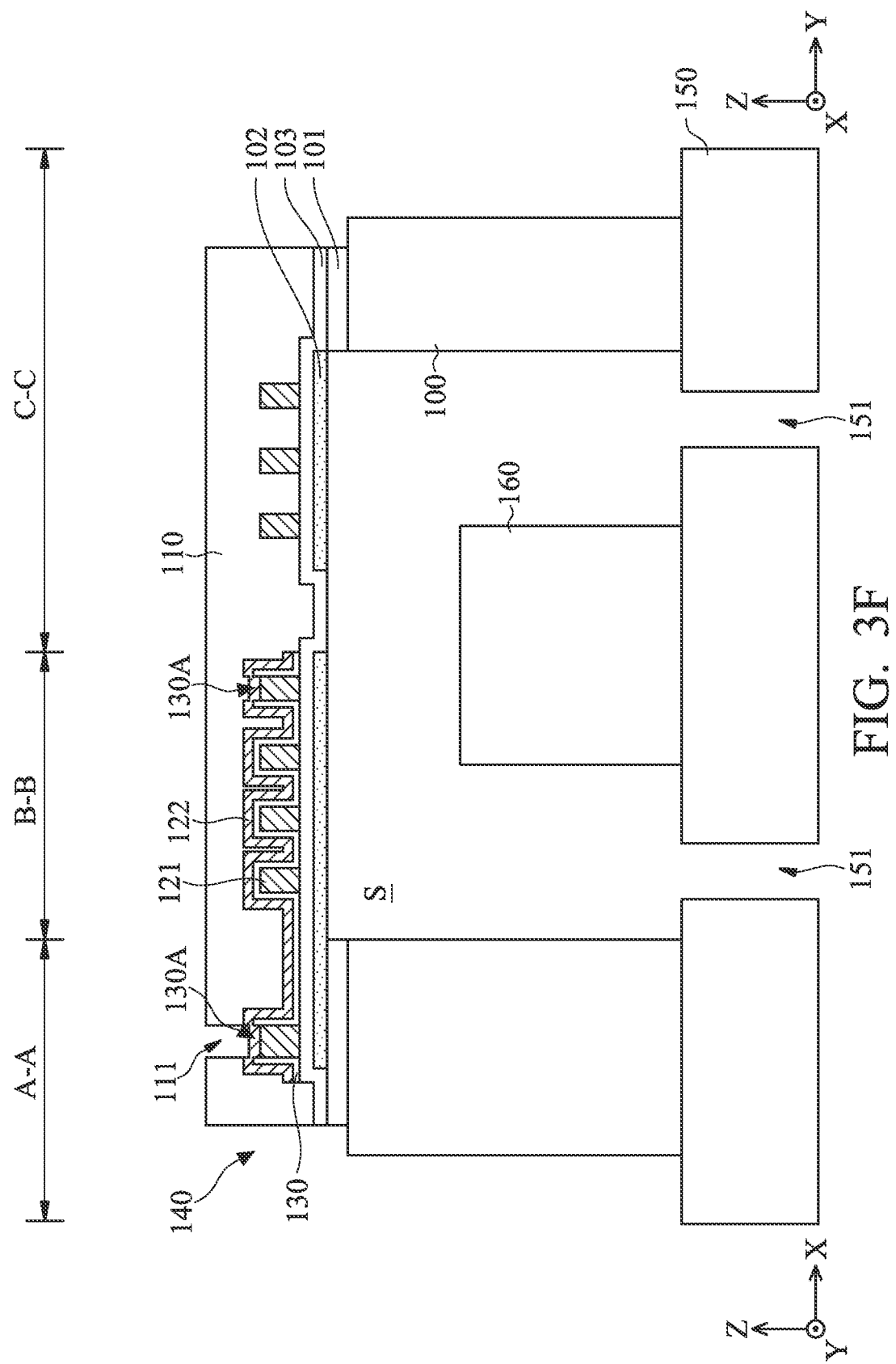

As shown in FIG. 3F, a carrier board 150 (such as a PCB) is disposed on or attached to the bottom surface of the substrate 100. That is, the substrate 100 is located between the carrier board 150 and the diaphragm 110. The carrier board 150 has one or more vent holes 151, which allow the hollow chamber S to communicate with the external environment. A first permanent magnetic element 160 is disposed on the carrier board 150 and in the hollow chamber S. The first permanent magnetic element 160 is used to cooperate with the multi-layered coil 120 (i.e., the magnetic field generated by the first permanent magnetic element 160 interacts with a current passing through the multi-layered coil 120) to generate a force (e.g., Z-axis force) in the normal direction of the substrate 100, and the diaphragm 110 can vibrate/oscillate relative to the substrate 100 due to the force to generate sound. In some embodiments, the first permanent magnetic element 160 is a neodymium iron boron magnet. In other embodiments, other permanent magnet materials may also be used.

Figure 3G:
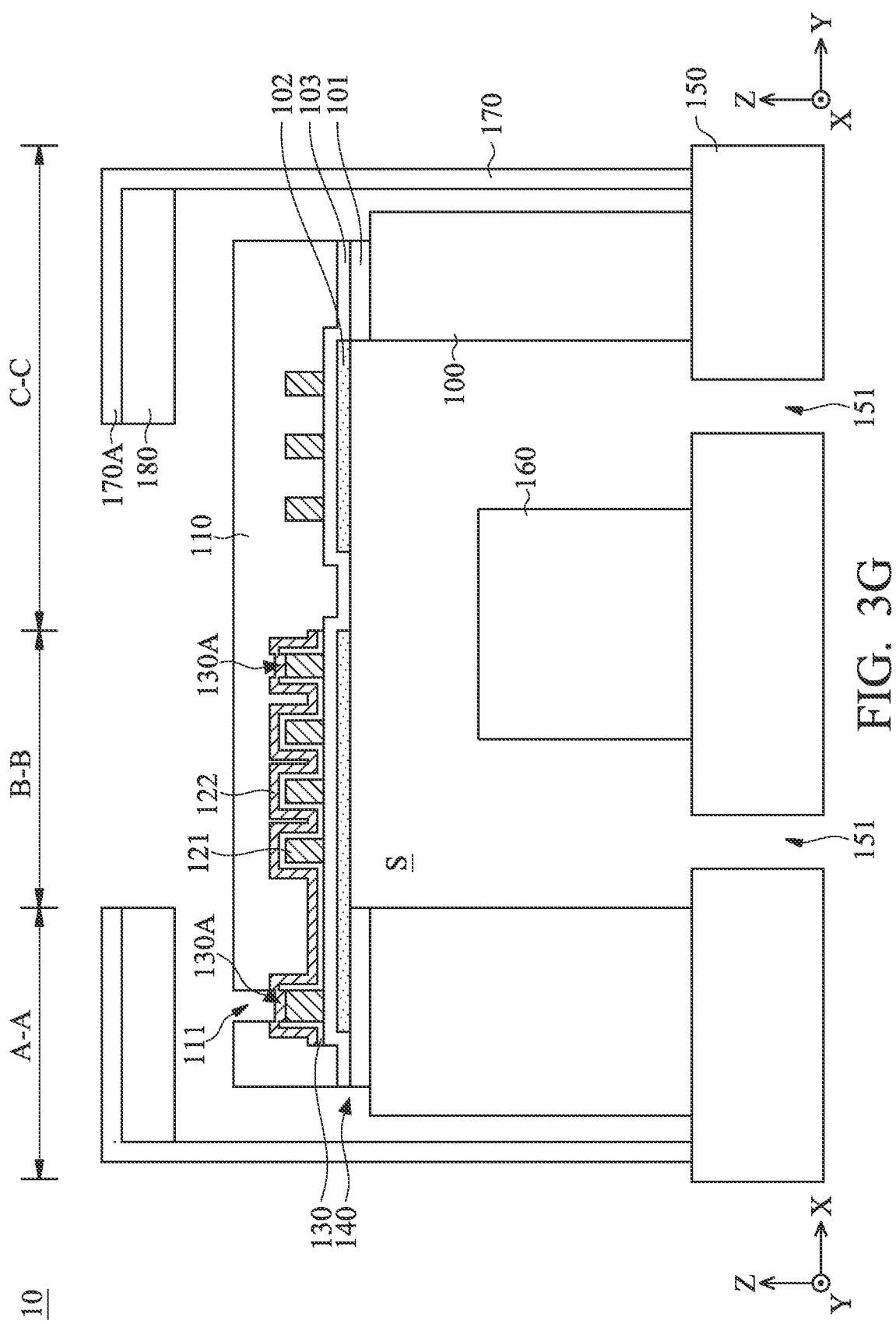

As shown in FIG. 3G, a package lid 170 is disposed on or attached to the carrier board 150. The package lid 170 is designed to wrap around and protect the substrate 100 and the diaphragm 110. Also, the package lid 170 has a lid opening 170A to allow acoustic energy due to vibration of the diaphragm 110 to travel out of the package structure of the micro speaker 10. In some embodiments, the package lid 170 is made of a metal material having a magnetic permeability lower than about $1.25 \times 10^{-4}$ H/mm, such as gold (Au), copper (Cu), aluminum (Al), or a combination thereof, which helps maintain or confine the magnetic field in the package structure of the micro speaker 10.

Still referring to FIG. 3G, a second permanent magnetic element 180 is disposed above the diaphragm 110. In the example of FIG. 3G, the second permanent magnetic element 180 may have a ring structure conforming to the shape of the lid opening 170A of package lid 170 (for example, the lid opening 170A is circular and the second permanent magnetic element 180 is circular ring-shaped, but the present disclosure is not limited thereto), and may be disposed below the lid opening 170A. In some embodiments, the second permanent magnetic element 180 is a neodymium iron boron magnet. In other embodiments, other permanent magnet materials may also be used.

The second permanent magnetic element 180 and the first permanent magnetic element 160 can attract each other to increase the deflection of the planar magnetic field. Accordingly, the force generated by the current passing through the multi-layered coil 120 and the planar magnetic field in the normal direction of the substrate 100 increases, so that the diaphragm 110 has a better frequency response, thereby improving the performance of the micro speaker 10.

In some embodiments, the distance between the first permanent magnetic element 160 and the second permanent magnetic element 180 may be in a range between about 00 μm and about 1000 μm. If the distance is greater than 1000 μm, there may not be sufficient attraction between the first permanent magnetic element 160 and the second permanent magnetic element 180 to increase the deflection of the planar magnetic field, resulting in a smaller frequency response of the micro speaker. Therefore, the performance of the micro speaker is degraded. If the distance is less than 200 μm, when the diaphragm 110 deforms up and down relative to the substrate 100, it may repeatedly contact and strike the first permanent magnetic element 160 and/or the second permanent magnetic element 180, which causes damage to the micro speaker structure. Therefore, the reliability of the micro speaker is reduced.

Figure 4:
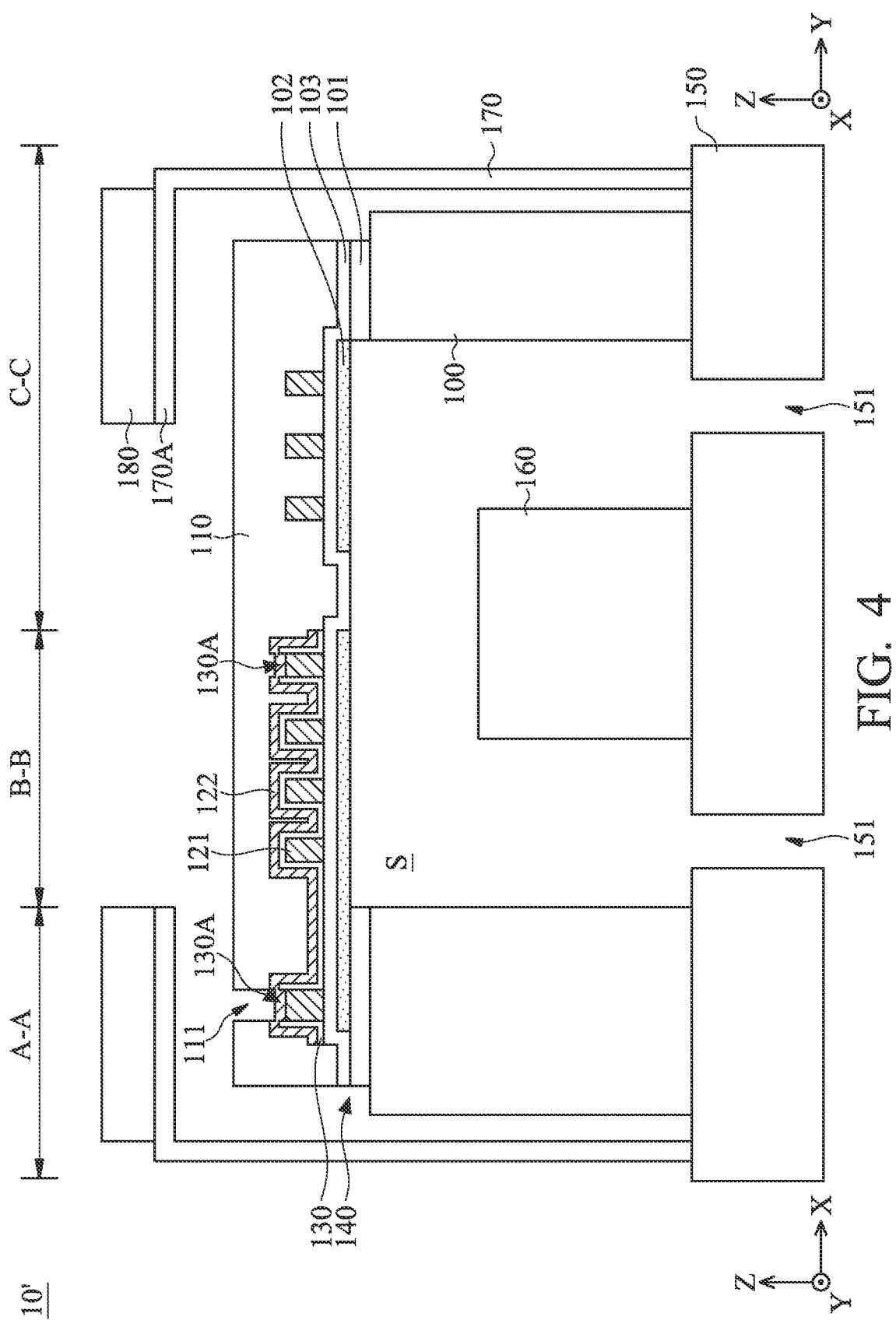
FIG. 4 illustrates a cross-sectional view of a package structure of a micro speaker in accordance with some alternative embodiments.

In addition, the position of the second permanent magnetic element 180 is not limited to the embodiments shown in FIG. 3G. In some alternative embodiments, the second permanent magnetic element 180 of a micro speaker 10' may also be disposed above the lid opening 170A of package lid 170, as shown in FIG. 4. In addition, the second permanent magnetic element 180 may also be omitted in other embodiments.

Figure 5A:
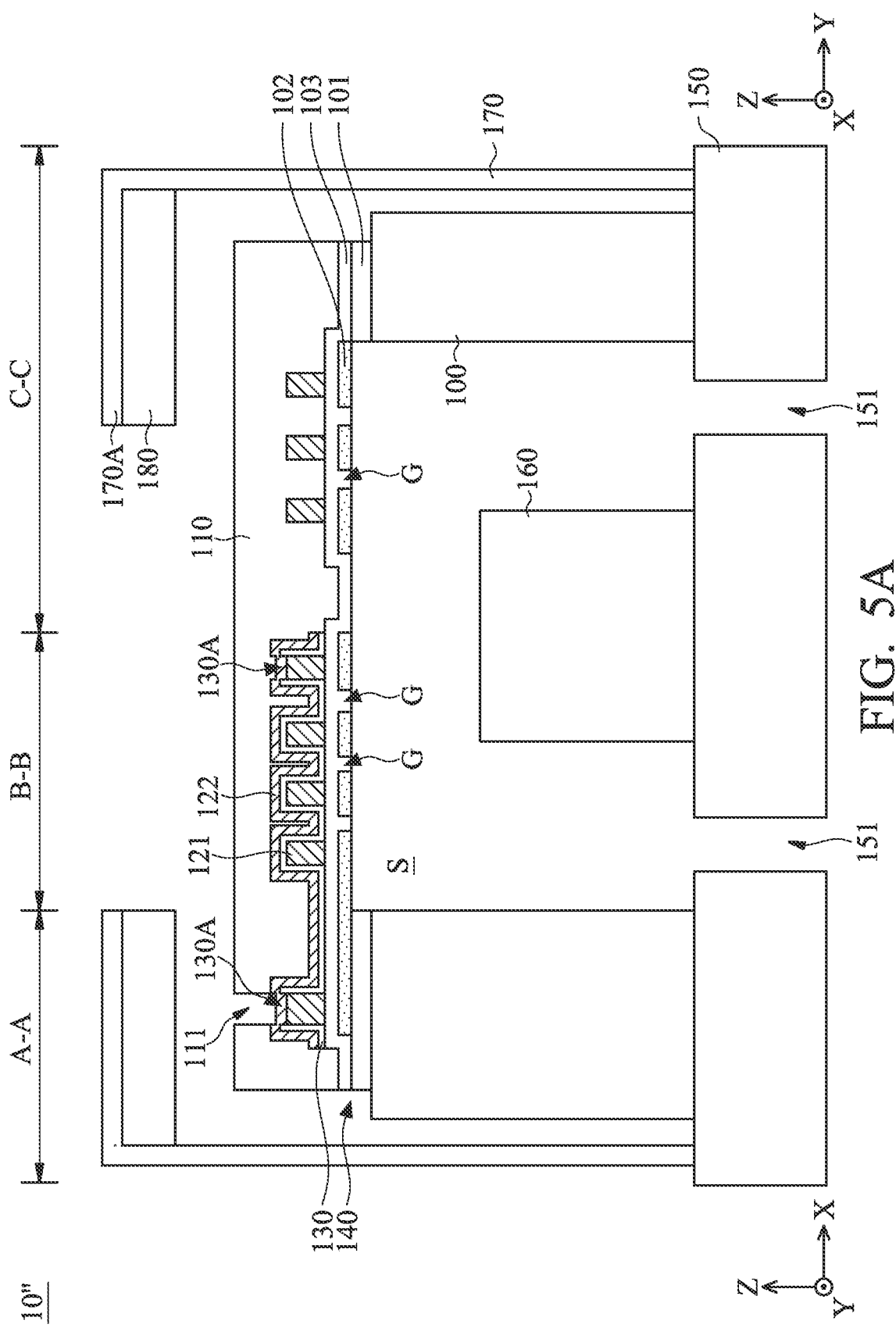
FIG. 5A illustrates a cross-sectional view of a package structure of a micro speaker in accordance with some alternative embodiments.

FIG. 5A illustrates a cross-sectional view of a package structure of a micro speaker 10" in accordance with some alternative embodiments. The package structure of the micro speaker 10" differs from the package structure of the micro speaker 10 shown in FIG. 2 or 3G only in that the etch stop metal layer 102 under the coil 120 is a discontinuous structure. More specifically, the etch stop metal layer 102, after being patterned, includes a plurality of discrete (solid) portions corresponding to adjacent coil portions of the first metal layer 121 (e.g., spiral structure 121A) of the coil 120, with an opening G formed between adjacent coil portions of the first metal layer 121.

Figure 5B:
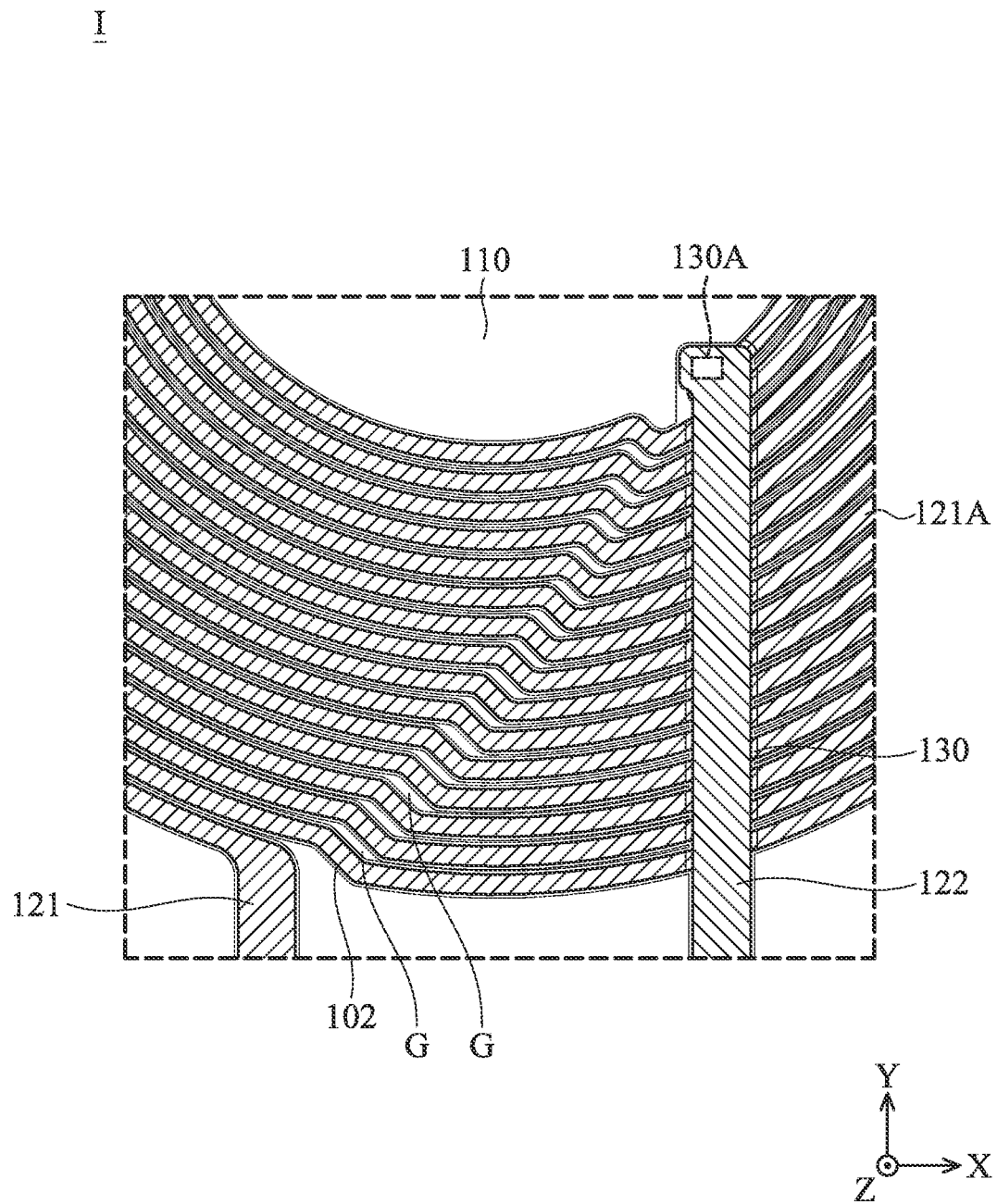
FIG. 5B illustrates an enlarged view of the area I shown in FIG. 1A in accordance with some alternative embodiments.

FIG. 5B illustrates an enlarged view of the area I shown in FIG. 1A in accordance with some alternative embodiments. It should be understood that the etch stop metal layers 102 in FIGS. 5A and 5B have corresponding arrangements. In the example of FIGS. 5A and 5B, the solid portions of the etch stop metal layer 102 respectively correspond to the coil portions of the first metal layer 121 of the coil 120, and the openings G of the etch stop metal layer 102 respectively correspond to the gaps between adjacent coil portions of the first metal layer 121 of the coil 120. By removing undesired portions (i.e., where the openings G are formed) of the etch stop metal layer 102, the diaphragm 110 (see FIG. 5A) can be more flexible, thereby improving the performance of the micro speaker 10".

Figure 6:
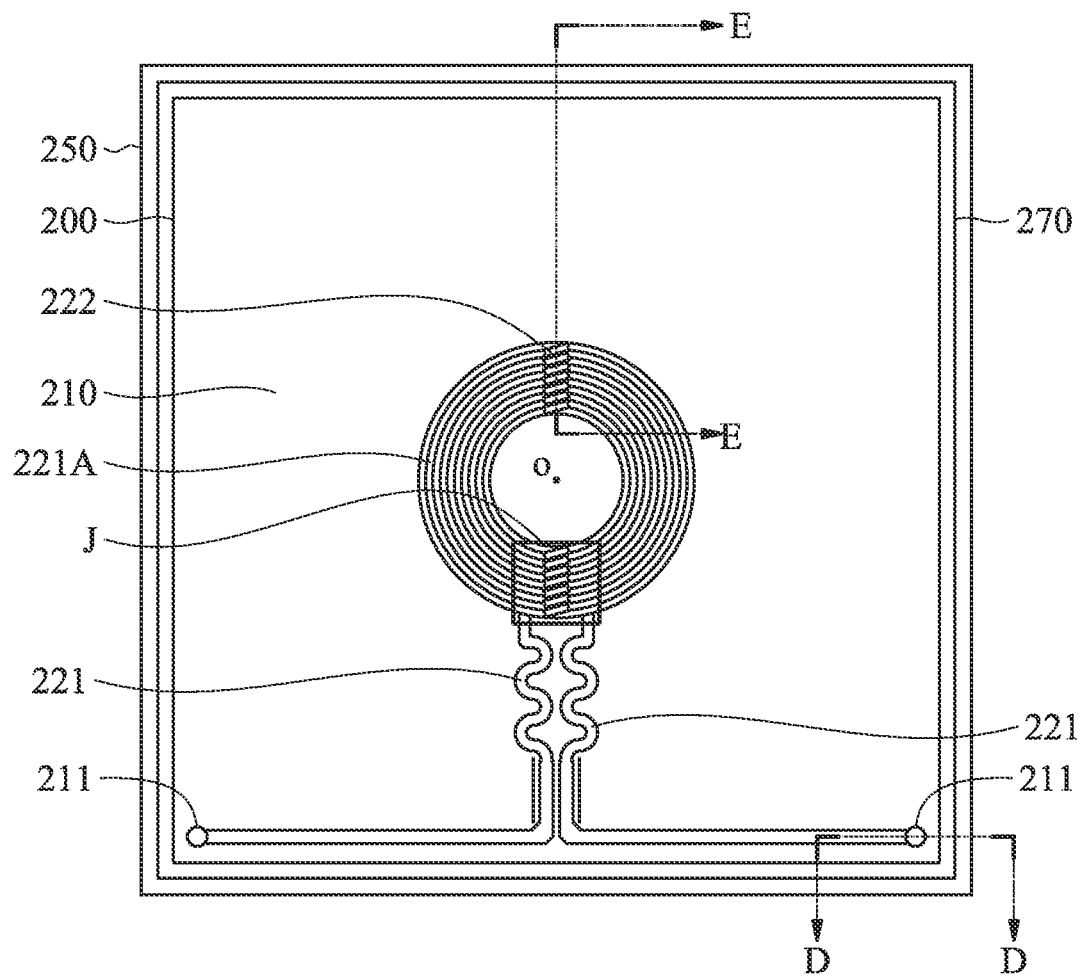
FIG. 6 illustrates a top view of a micro speaker in accordance with some other embodiments.

FIG. 6 illustrates a top view of a micro speaker 20 in accordance with some other embodiments. It should be appreciated that the micro speaker 20 may include the same or similar components as the micro speaker 10 shown in FIG. 1A, and those components that are the same or similar will be labeled with similar numerals, the details thereof are not repeated here. For example, the micro speaker 20 includes a substrate 200, a diaphragm 210, a multi-layered coil 220 (which may also be referred to as a coil 220), a carrier board 250, and a package lid 270. It should be noted that in the example of FIG. 6A, the diaphragm 210 and the package lid 270 are only represented by rectangles in order to show internal structures of the micro speaker 20.

Figure 7:
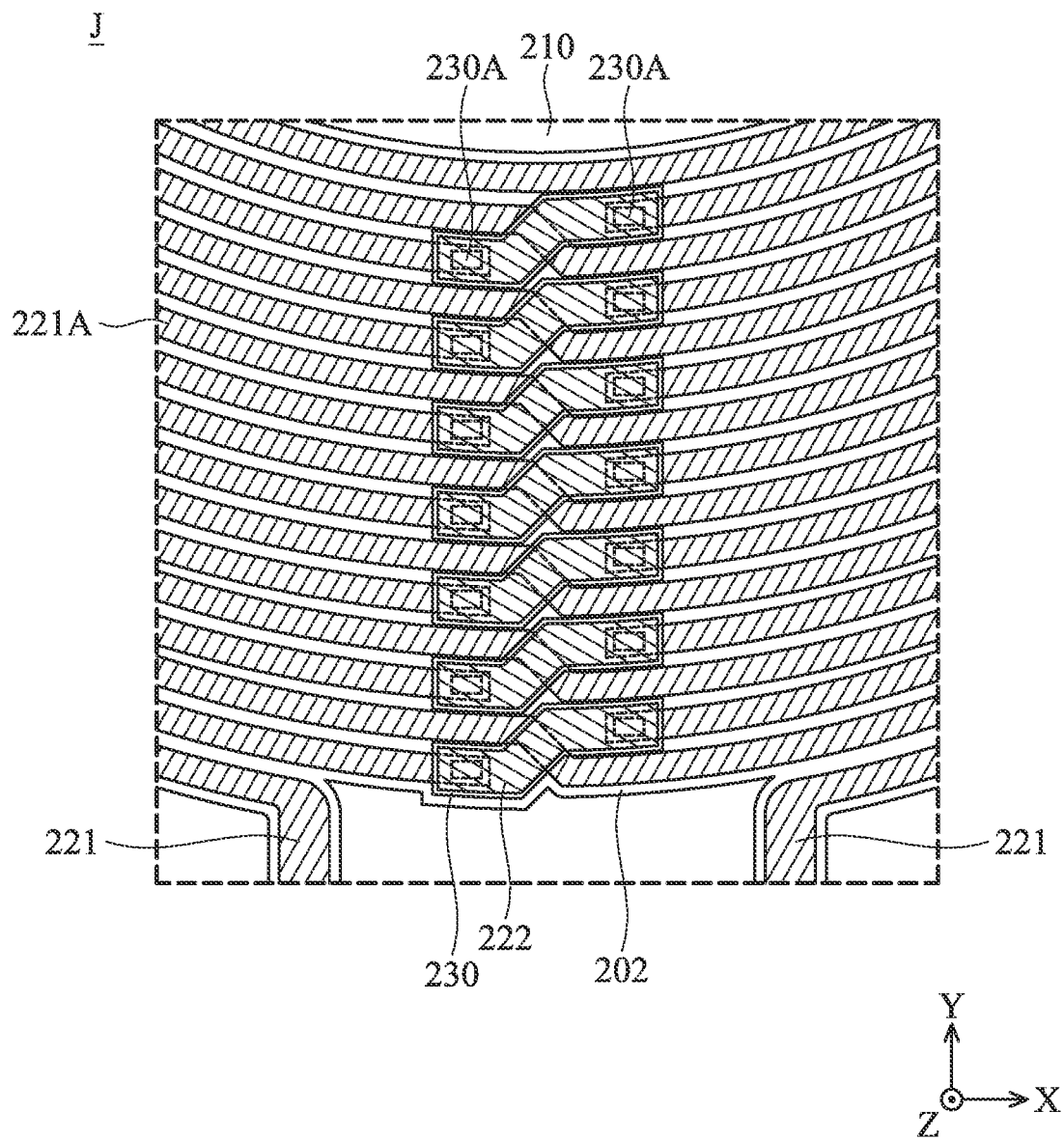
FIG. 7 illustrates an enlarged view of the area J shown in FIG. 6 in accordance with some other embodiments.

Similarly, in the present embodiment, the multi-layered coil 220 is embedded in the diaphragm 210, and includes a first metal layer 221 and a second metal layer 222, which are located on different horizontal planes, which may be parallel to the X-Y plane shown in FIG. 6. The difference between the micro speaker 20 and the micro speaker 10 shown in FIG. 1A is that the first metal layer 221 includes a plurality of coaxial segments 221A disposed around the central axis O of the diaphragm 210, and those coaxial segments 221A are electrically connected by the second metal layer 222. It should be appreciated that the multi-layered coil 220 is schematically illustrated in FIG. 6, and the detailed structure of the multi-layered coil 220 (such as the coaxial segments 221A) is shown in FIG. 7. Furthermore, the second metal layer 222 is also symmetrically disposed around the central axis O of the diaphragm 210. For example, as shown in FIG. 6, the second metal layer 222 is distributed on both sides (e.g., the shown upper and lower sides) of the central axis O.

FIG. 7 illustrates an enlarged view of the area J shown in FIG. 6 in accordance with some embodiments. As shown in FIG. 7, the second metal layer 222 connects the separate coaxial segments 221A of the first metal layer 221. A dielectric layer 230 is disposed between the first metal layer 221 and the second metal layer 222 to prevent a short circuit between the first metal layer 221 and the second metal layer 222. Through holes 230A are formed in the dielectric layer 230, and the first metal layer 221 is electrically connected to the second metal layer 222 through the through holes 230A.

Figure 8:
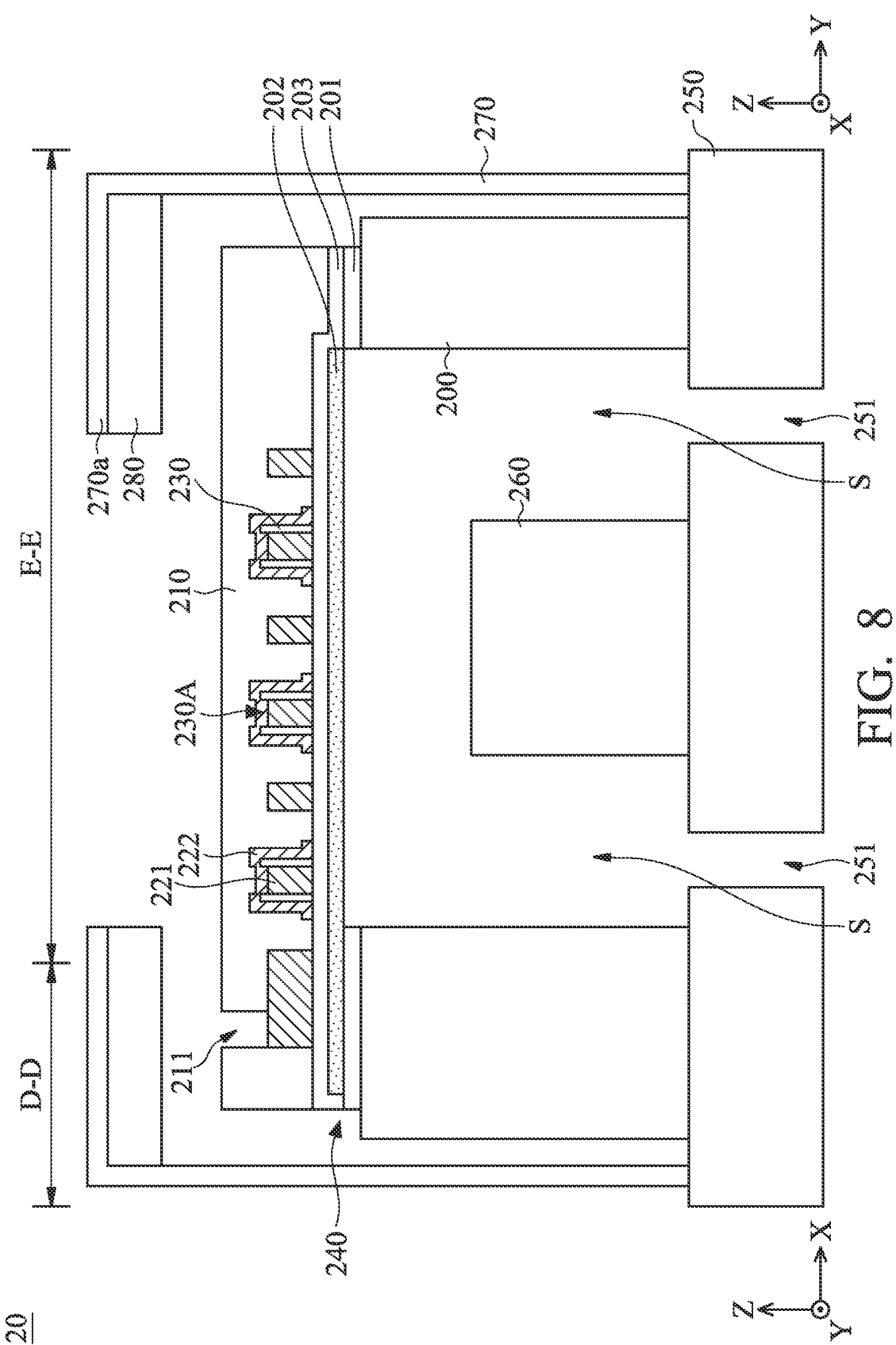
FIG. 8 illustrates a cross-sectional view of a package structure of a micro speaker in accordance with some other embodiments.

FIG. 8 illustrates a cross-sectional view of the package structure of the micro speaker 20 shown in FIG. 6 in accordance with some embodiments. It should be noted that FIG. 8 includes cross-sectional views along lines D-D and E-E shown in FIG. 6. Two sets of coordinate axes are provided in FIG. 8, wherein one set of coordinate axes in the left-hand side correspond the cross-sectional view along line D-D, and the other set of coordinate axes in the right-hand side correspond the cross-sectional view along line E-E.

The detailed package structure of the micro speaker 20 is shown in FIG. 8. The manufacturing processes of the package structure of the micro speaker 20 are substantially the same as the manufacturing processes of the package structure of the micro speaker 10 described above, and the details thereof are not repeated here. In the example of FIG. 8, the second metal layer 222 is substantially uniformly distributed in the diaphragm 210 (e.g., symmetrically disposed around the central axis O of the diaphragm 210). In this way, when the diaphragm 210 vibrates/oscillates relative to the substrate 200, the distribution of the oscillating force may be more even. Therefore, the total harmonic distortion (THD) value of the micro speaker 20 can be reduced, and the lifetime of the micro speaker 20 can be longer. In addition, the etch stop metal layer 202, first permanent magnetic element 260 and the second permanent magnetic element 280 in this embodiments are similar to the etch stop metal layer 102, first permanent magnetic element 160 and the second permanent magnetic element 180 of the embodiments shown in FIG. 1B, respectively.

In summary, various embodiments of the present disclosure provide a package structure of a micro speaker and the method for forming the same. In the disclosed package structure, a permanent magnetic element is disposed under the diaphragm, and the magnetic field generated by the permanent magnetic element interacts with the current passing through the multilayer coil to generate a force in the normal direction of the substrate to make the diaphragm vibrate to generate sound. There is another permanent magnetic element disposed above or under the package lid of the package structure in some embodiments. The permanent magnetic elements positioned above and under the diaphragm attract each other to increase the deflection of the planar magnetic field. Accordingly, the force generated by the current passing through the multi-layered coil and the planar magnetic field in the normal direction of the substrate increases, so that the diaphragm has a better frequency response, thereby improving the performance of the micro speaker.

In addition, during the manufacturing, the coil is formed on the semiconductor wafer and then covered with the diaphragm, so that the coil is embedded in the diaphragm. Also, an etch stop metal layer is pre-formed on the semiconductor wafer before forming the coil, and the etch stop metal layer is designed to overlap the subsequently formed coil (as shown in FIG. 2 or FIG. 5B, for example), so that the coil can be well protected during the etching process. This helps improve process yield and device/product reliability. Furthermore, due to the use of MEMS technology, the package structure of the micro speaker of the present disclosure also has the advantages of batch production, high consistency, high yield, small area, and low cost.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package structure of a micro speaker, comprising:
a substrate having a hollow chamber;
a diaphragm suspended over the hollow chamber;
a coil embedded in the diaphragm;
an etch stop layer positioned directly below the coil and overlapping the coil in a direction that is perpendicular to a top surface of the diaphragm, wherein the etch stop layer is made of a metal material;
a carrier board disposed on a bottom surface of the substrate;
a first permanent magnetic element disposed on the carrier board and in the hollow chamber; and
a package lid wrapped around the substrate and the diaphragm, wherein the package lid has a lid opening that exposes a portion of the top surface of the diaphragm.

2. The package structure of the micro speaker as claimed in claim 1, wherein the diaphragm comprises polydimethylsiloxane (PDMS), phenolic epoxy resin, polyimide, or a combination thereof.

3. The package structure of the micro speaker as claimed in claim 1, wherein a Young's modulus of the diaphragm is between 1 MPa and 100 GPa.

4. The package structure of the micro speaker as claimed in claim 1, wherein a thickness of the diaphragm is between 0.1 μm and 20 μm.

5. The package structure of the micro speaker as claimed in claim 1, wherein the metal material of the etch stop layer comprises aluminum, copper, aluminum-copper alloy, aluminum-silicon alloy, or aluminum-silicon-copper alloy.

6. The package structure of the micro speaker as claimed in claim 1, wherein a thickness of the etch stop layer is greater than 100 μm.

7. The package structure of the micro speaker as claimed in claim 1, wherein in a plan view, the etch stop layer is a continuous structure and has no openings in gaps between adjacent coil portions of the coil.

8. The package structure of the micro speaker as claimed in claim 1, wherein in a plan view, the etch stop layer is a discontinuous structure and includes a plurality of solid portions corresponding to coil portions of the coil and a plurality of openings corresponding to gaps between adjacent coil portions of the coil.

9. The package structure of the micro speaker as claimed in claim 1, wherein the etch stop layer is positioned between the coil and the hollow chamber.

10. The package structure of the micro speaker as claimed in claim 1, wherein the coil comprises a first metal layer and a second metal layer, and the first metal layer is electrically connected to the second metal layer in an opening of the diaphragm.

11. The package structure of the micro speaker as claimed in claim 10, wherein the first metal layer and the second metal layer are each made of aluminum silicon, aluminum, copper, or a combination thereof.

12. The package structure of the micro speaker as claimed in claim 10, wherein a width of each of the first metal layer and the second metal layer is between 1 μm and 500 μm, and a thickness of each of the first metal layer and the second metal layer is between 0.1 μm and 20 μm.

13. The package structure of the micro speaker as claimed in claim 10, wherein the first metal layer includes a spiral structure surrounding a central axis of the diaphragm, and the second metal layer crosses over the spiral structure of the first metal layer and is electrically connected to the first metal layer.

14. The package structure of the micro speaker as claimed in claim 1, wherein the carrier board has at least one vent hole, and the at least one vent hole is configured to allow the hollow chamber to communicate with an external environment.

15. The package structure of the micro speaker as claimed in claim 1, wherein the package lid is made of a metal material having a magnetic permeability lower than $1.25 \times 10^{-4}$ H/m.

16. The package structure of the micro speaker as claimed in claim 1, further comprising a second permanent magnetic element disposed on the package lid, wherein the second permanent magnetic element is located below or above the lid opening.

17. A method for forming a package structure of a micro speaker, comprising:
forming an etch stop layer over a substrate, wherein the etch stop layer is made of a metal material;
forming a dielectric layer over the etch stop layer and the substrate;
forming a coil structure on the dielectric layer;

forming a diaphragm on the coil structure so that the coil structure is buried in the diaphragm;

forming a hollow chamber in the substrate by performing an etching process on a bottom surface of the substrate, wherein the coil structure is isolated from the hollow chamber by the etch stop layer after the etching process;

attaching a carrier board to the bottom surface of the substrate, wherein a first permanent magnetic element is mounted on the carrier board and positioned in the hollow chamber; and mounting a package lid on the carrier board, wherein the package lid is wrapped around the substrate and the diaphragm, and has a lid opening that exposes a portion of the diaphragm.

18. The method as claimed in claim 17, further comprising patterning the etch stop layer so that the etch stop layer has a discontinuous structure, wherein in a plan view, the discontinuous structure includes a plurality of solid portions corresponding to coil portions of the coil structure and a plurality of openings corresponding to gaps between adjacent coil portions of the coil structure.

19. The method as claimed in claim 17, wherein the coil structure is a multi-layered structure including a first metal layer and a second metal layer over and electrically connected to the first metal layer, and the method further comprises:

patterning the dielectric layer to form an opening in the dielectric layer, wherein the first metal layer is electrically connected to the second metal layer in the opening.

20. The method as claimed in claim 17, further comprising disposing a second permanent magnetic element on the package lid, wherein the diaphragm is located between the first and second permanent magnetic elements.

* * * * *